(12) United States Patent
Do et al.

(10) Patent No.: US 12,500,112 B2
(45) Date of Patent: Dec. 16, 2025

(54) NOZZLE AND BOND HEAD HEATER OF THERMAL COMPRESSION BONDING (TCB) TOOL AND DIE ATTACHMENT PROCESS USING THEREOF

(71) Applicant: Intel Corporation, Santa Clara, CA (US)

(72) Inventors: Tin Do, Ho Chi Minh (VN); Long Thanh Nguyen, Ho Chi Minh (VN); Phu Tuc Nguyen, Ho Chi Minh (VN); Le Hoai Bao Nguyen, Dong Nai (VN)

(73) Assignee: Intel Corporation, Santa Clara, CA (US)

( * ) Notice: Subject to any disclaimer, the term of this patent is extended or adjusted under 35 U.S.C. 154(b) by 959 days.

(21) Appl. No.: 17/685,421

(22) Filed: Mar. 3, 2022

(65) Prior Publication Data
US 2023/0282509 A1    Sep. 7, 2023

(51) Int. Cl.
*H01L 21/683*    (2006.01)
*H01L 21/603*    (2006.01)

(52) U.S. Cl.
CPC ........ *H01L 21/6838* (2013.01); *H01L 21/603* (2021.08)

(58) Field of Classification Search
CPC ............. H01L 21/603; H01L 21/67144; H01L 21/6838; H01L 24/741
See application file for complete search history.

(56) References Cited

U.S. PATENT DOCUMENTS

| | | | | |
|---|---|---|---|---|
| 5,564,682 A | * | 10/1996 | Tsuji | H01L 21/6838 269/21 |
| 2003/0102682 A1 | * | 6/2003 | Kurokawa | H01L 21/6838 294/188 |
| 2007/0128889 A1 | * | 6/2007 | Goto | H01L 21/67103 414/935 |
| 2010/0195080 A1 | * | 8/2010 | Compen | H01L 21/6838 414/800 |

FOREIGN PATENT DOCUMENTS

WO    WO-2008018164 A1 *   2/2008   ....... H01L 21/67092

\* cited by examiner

*Primary Examiner* — Shaun R Hurley
(74) *Attorney, Agent, or Firm* — Viering, Jentschura & Partner mbB

(57) ABSTRACT

An apparatus includes a nozzle including a small die vacuum line disposed on a surface of the nozzle, and a large die vacuum line disposed on the surface and surrounding the small die vacuum line. The nozzle further includes a first die vacuum hole disposed through the surface and the small die vacuum line, and a second die vacuum hole disposed through the surface and the large die vacuum line. The small die vacuum line and the first die vacuum hole are configured to provide a vacuum to a small semiconductor die to be attached to a substrate, and the small die vacuum line, the large die vacuum line, the first die vacuum hole and the second die vacuum hole are configured to provide the vacuum to a large semiconductor die to be attached to the substrate.

19 Claims, 9 Drawing Sheets

NOZZLE AND BOND HEAD HEATER OF THERMAL COMPRESSION BONDING (TCB) TOOL AND DIE ATTACHMENT PROCESS USING THEREOF

BACKGROUND

A thermal compression bonding (TCB) tool performs TCB of a die onto a substrate. For a semiconductor product including 2 dies or more, a nozzle of the TCB tool may need to be changed to another nozzle once a die is bonded to a substrate to bond another die to the substrate. This is because the dies can be different sizes, and the nozzles may be sized to match the different sizes of the dies.

However, changing the nozzle may increase a runtime of the TCB tool each time the nozzle is changed. Further, changing the nozzle can result in a nozzle change error, due to a software bug, a signal transfer issue, a movement of the TCB tool and/or a vision issue.

To address the above problems, engineers tried software optimization for a progress of the movement of the TCB tool and/or vision to avoid conflicts between such activities. Alternatively, engineers followed instructions to verify factors that may cause the nozzle change error and tried fixing those issues. However, downtime control of the TCB tool remains an issue.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1:
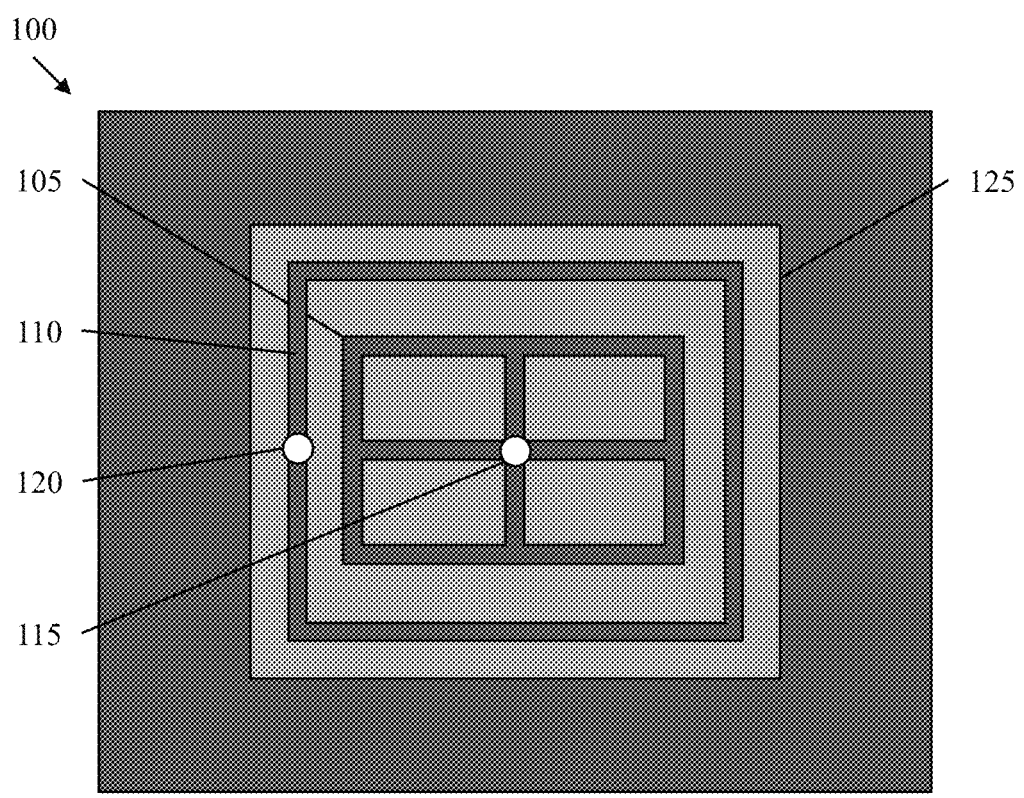
FIG. 1 is a top view of a nozzle of a TCB tool according to aspects of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure relates to a nozzle and a bond head heater of a TCB tool and a die attachment process using thereof.

A present apparatus may include a nozzle including a small die vacuum line disposed on a surface of the nozzle, and a large die vacuum line disposed on the surface and surrounding the small die vacuum line. The nozzle further includes a first die vacuum hole disposed through the surface and the small die vacuum line, and a second die vacuum hole disposed through the surface and the large die vacuum line. The small die vacuum line and the first die vacuum hole are configured to provide a vacuum to a small semiconductor die to be attached to a substrate, and the small die vacuum line, the large die vacuum line, the first die vacuum hole and the second die vacuum hole are configured to provide the vacuum to a large semiconductor die to be attached to the substrate.

In another aspect, a method pursuant to the present disclosure may include providing a vacuum to a small semiconductor die, to pick up and hold the small semiconductor die on a surface of the nozzle, attaching the held small semiconductor die to a substrate, and based on the small semiconductor die being attached to the substrate, releasing and moving the nozzle away from the small semiconductor die to a large semiconductor die. The method may further include providing the vacuum to the large semiconductor die to which the nozzle is moved, to pick up and hold the large semiconductor die on the surface of the nozzle, and attaching the held large semiconductor die to the substrate In yet another aspect, a present apparatus may include providing means for providing a vacuum to a small semiconductor die, to pick up and hold the small semiconductor die on a surface of the nozzle, attaching means for attaching the held small semiconductor die to a substrate, and moving means for, based on the small semiconductor die being attached to the substrate, releasing and moving the nozzle away from the small semiconductor die to a large semiconductor die. The providing means may be further for providing the vacuum to the large semiconductor die to which the nozzle is moved, to pick up and hold the large semiconductor die on the surface of the nozzle, and the attaching means may be further for attaching the held large semiconductor die to the substrate In detail, the nozzle may be designed to be used for attaching, to a substrate, 2 dies or more included in multiple die products. The bond head heater may include an additional die vacuum channel for the nozzle. A die vacuum controller that controls the nozzle and the bond head heater may include an additional switch controller for controlling the additional die vacuum channel.

The above-detailed aspects may reduce a changing time of a nozzle, a cost of the TCB tool, operation spare parts errors and a troubleshooting time of the nozzle.

FIG. 1 is a top view of a nozzle 100 of a TCB tool according to aspects of the present disclosure.

Referring to FIG. 1, the nozzle 100 includes, on a surface 125, a small die vacuum line 105, and a large die vacuum line 110 surrounding the small die vacuum line 105 and covering a larger surface area than the small die vacuum line 105. The nozzle 100 further includes, through the surface 125, a die vacuum hole 115 disposed through (e.g., at a center of) the small die vacuum line 105, and a large die vacuum hole 120 disposed through the large die vacuum line 110. The die vacuum hole 115 and the large die vacuum hole 120 may be disposed along a line extending through a center of the surface 125 of the nozzle 100.

The nozzle 100 may be physically and directly placed on a die. The nozzle 100 may further receive a vacuum from a bond head heater, and may provide the vacuum to the die to pick up and hold the die for attachment to a substrate.

The small die vacuum line 105 and the die vacuum hole 115 may be used to provide the vacuum to a small die or a large die. The small die vacuum line 105, the large die vacuum line 110 and the die vacuum holes 115 and 120 may be combined and used to provide the vacuum to the large die. In an example, if a difference between a width or length of the small die and a width or length of the large die is below 2600 microns, then only the small die vacuum line 105 and the die vacuum hole 115 is used to provide the vacuum to the large die. Otherwise, the small die vacuum line 105, the large die vacuum line 110 and the die vacuum holes 115 and 120 are combined and used to provide the vacuum to the large die.

Accordingly, the single nozzle 100 may be used to provide the vacuum to multiple dies of different sizes. As such, the nozzle 100 does not have to be changed, reducing a runtime of the TCB tool and eliminating error(s) from changing a nozzle.

The surface 125 of the nozzle 100 may transfer thermal to a die. The surface 125 may further create a closed loop with the die to prevent a leak of a vacuum that is provided to the die.

Figure 2A:
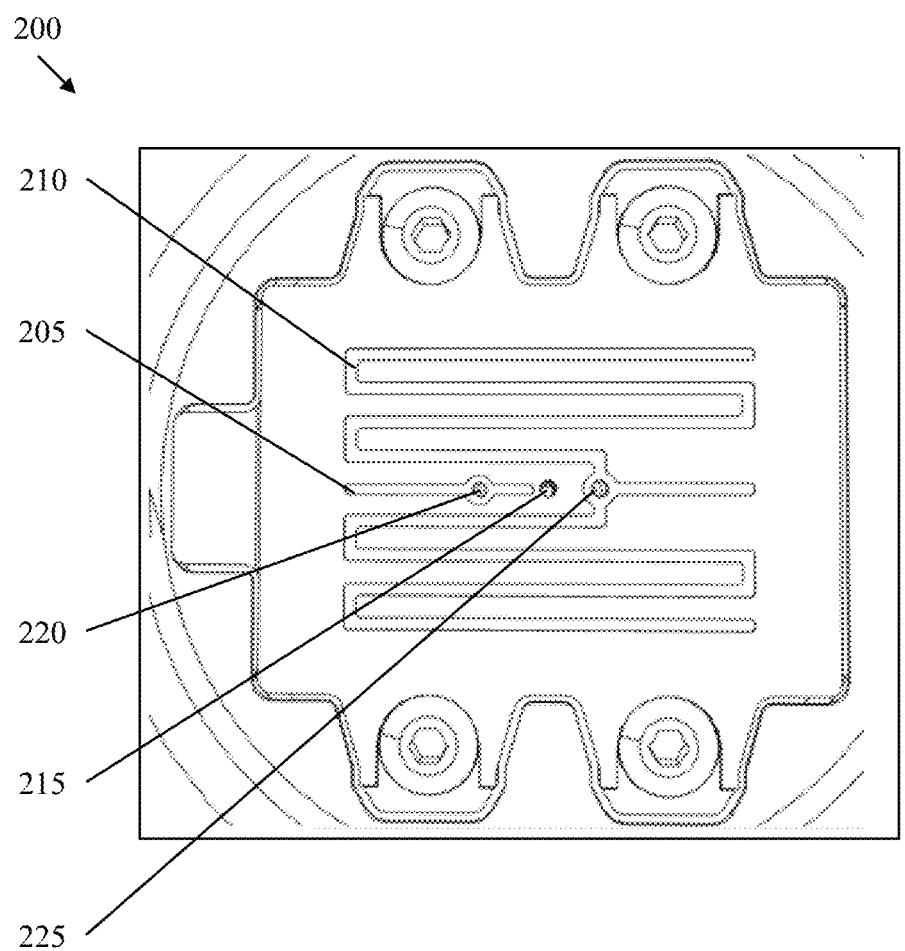
FIG. 2A is a bottom view of a bond head heater of a TCB tool according to aspects of the present disclosure.

FIG. 2A is a bottom view of a bond head heater 200 of a TCB tool according to aspects of the present disclosure.

Referring to FIG. 2A, the bond head heater 200 includes, on a bottom surface, a large die vacuum line 205 and a nozzle vacuum line 210. The bond head heater 200 further includes, through the bottom surface, a die vacuum hole 215 interposed between the large die vacuum line 205 and the nozzle vacuum line 210, a large die vacuum hole 220 disposed through the large die vacuum line 205, and a nozzle vacuum hole 225 disposed through the nozzle vacuum line 210. The die vacuum hole 215, the large die vacuum hole 220 and the nozzle vacuum hole 225 may be disposed along a line extending through a center of the bottom surface of the bond head heater 200.

The bond head heater 200 may be physically and directly placed on the nozzle 100 of FIG. 1. Further, the bond head heater 200 may provide a vacuum to the nozzle 100 to pick up and hold the nozzle 100, which provides the vacuum to a die to pick up and hold the die. The bond head heater 200 may also heat (e.g., transfer thermal to) the picked-up nozzle 100 and the picked-up die, while the die is placed on a substrate, to attach the die to the substrate.

Referring to FIGS. 1 and 2A, the large die vacuum line 205 and the large die vacuum hole 220 may be respectively physically connected to and aligned with the large die vacuum line 110 and the large die vacuum hole 120 of the nozzle 100 to provide a vacuum to the large die vacuum hole 120, which provides the vacuum to a large die, even if the large die vacuum hole 220 is not centered with the large die vacuum hole 120. This is because the large die vacuum hole 220 may provide a vacuum for the large die vacuum line 205 to be physically aligned with the large die vacuum hole 120. A length of the large die vacuum line 205 may correspond to a length between the die vacuum hole 115 and a leftmost or rightmost edge of the nozzle 100. The large die vacuum line 205 and the large die vacuum hole 220 may be combined with the die vacuum hole 215 to provide the vacuum to the large die.

The die vacuum hole 215 may be physically connected to and aligned with the die vacuum hole 115 of the nozzle 100 to provide the vacuum to the die vacuum hole 115, which may provide the vacuum to a small die or the large die.

The nozzle vacuum line 210 and the nozzle vacuum hole 225 may provide the vacuum to the nozzle 100 to pick up and hold the nozzle 100 on the bottom surface of the bond head heater 200.

Figure 2B:
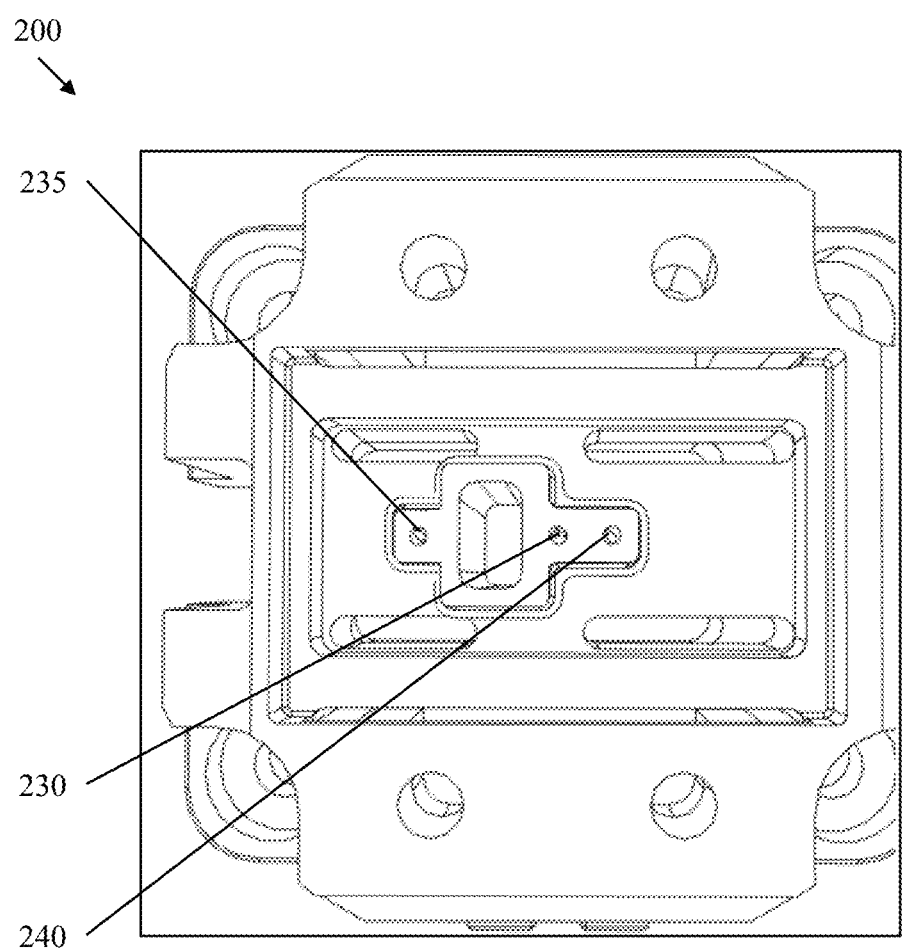
FIG. 2B is a planar view of a middle portion of the bond head heater of FIG. 2A.

FIG. 2B is a planar view of a middle portion of the bond head heater 200 of FIG. 2A.

Referring to FIGS. 2A and 2B, the middle portion of the bond head heater 200 includes a die vacuum channel 230 (tubing) corresponding to the die vacuum hole 215, a large die vacuum channel 235 (tubing) corresponding to the large die vacuum hole 220, a nozzle vacuum channel 240 (tubing) corresponding to the nozzle vacuum hole 225.

The large die vacuum channel 235 is physically connected to and aligned with the large die vacuum hole 220 to provide a vacuum to the large die vacuum hole 220. The large die vacuum channel 235 may be combined with the die vacuum channel 230 to provide the vacuum to a large die.

The die vacuum channel 230 is physically connected to and aligned with the die vacuum hole 215 to provide a vacuum to the die vacuum hole 215. The die vacuum channel 230 may be used to provide the vacuum to a small die or the large die.

The nozzle vacuum channel 240 is physically connected to and aligned with the nozzle vacuum hole 225 to provide a vacuum to the nozzle vacuum hole 225. The nozzle vacuum channel 240 may be used to provide the vacuum to the nozzle 100.

Figure 2C:
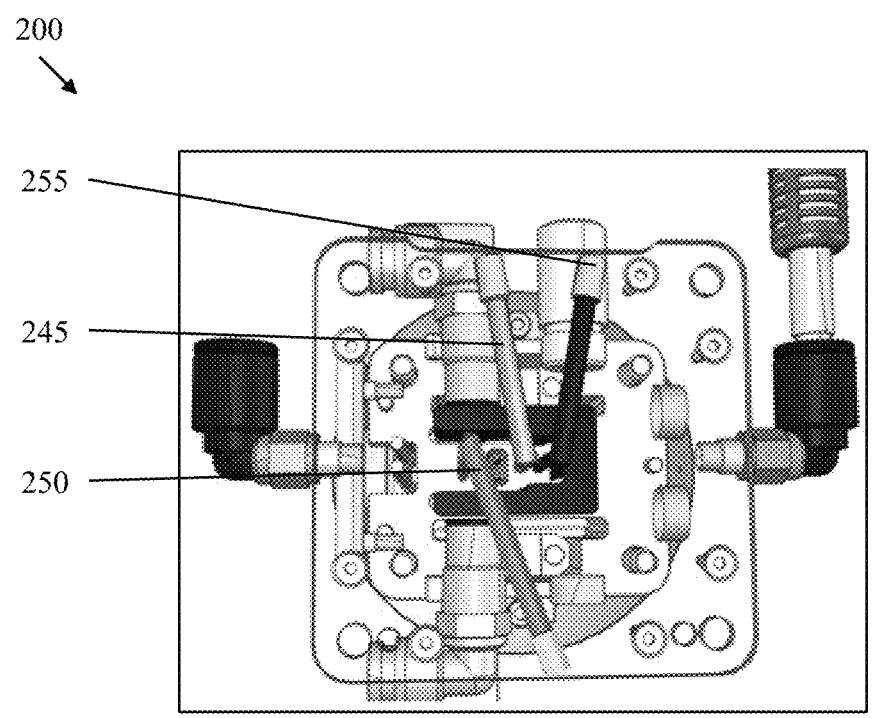
FIG. 2C is a top view of the bond head heater of FIG. 2A.

FIG. 2C is a top view of the bond head heater 200 of FIG. 2A.

Referring to FIGS. 2B and 2C, the bond head heater 200 includes, on a top surface, a die vacuum channel 245 (tubing) corresponding to the die vacuum channel 230, a large die vacuum channel 250 (tubing) corresponding to the large die vacuum channel 235, a nozzle vacuum channel 255 (tubing) corresponding to the nozzle vacuum channel 240.

The large die vacuum channel 250 is physically connected to and aligned with the large die vacuum channel 235 to provide a vacuum to the large die vacuum channel 235. The large die vacuum channel 250 may be combined with the die vacuum channel 245 to provide the vacuum to a large die.

The die vacuum channel 245 is physically connected to and aligned with the die vacuum channel 230 to provide a vacuum to the die vacuum channel 230. The die vacuum channel 245 may be used to provide the vacuum to a small die or the large die.

The nozzle vacuum channel 255 is physically connected to and aligned with the nozzle vacuum channel 240 to provide a vacuum to the nozzle vacuum hole 240. The nozzle vacuum channel 255 may be used to provide the vacuum to the nozzle 100.

Figure 3:
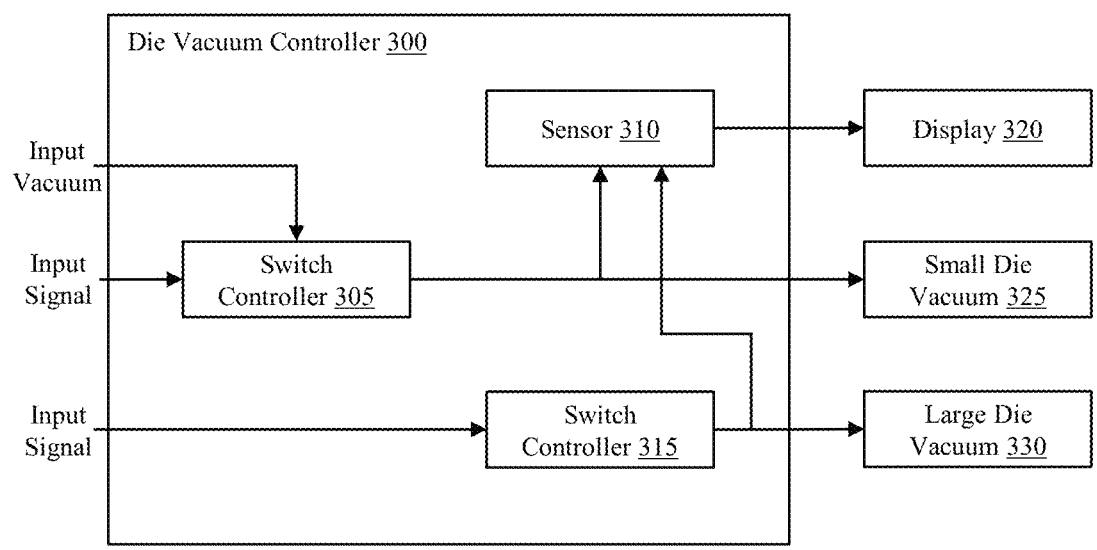
FIG. 3 is a block diagram of a die vacuum controller for the nozzle of FIG. 1 and the bond head heater 200 of FIGS. 2A-2C.

FIG. 3 is a block diagram of a die vacuum controller 300 for the nozzle 100 of FIG. 1 and the bond head heater 200 of FIGS. 2A-2C.

Referring to FIG. 3, the die vacuum controller 300 includes a switch controller 305, a sensor 310, and a switch controller 315.

The switch controller 305 may include, for example, a solenoid switch that receives an input signal, and switches on or off, based on the received input signal. The input signal may indicate whether to turn on or off the switch controller 305. Based on the switch controller 305 being switched on, the switch controller 305 controls the nozzle 100 and the bond head heater 200 to provide a small die vacuum 325 to a small die or a large die, to pick up and hold the small die or the large die and then attach it to a substrate. Further, the switch controller 305 may receive an input vacuum signal indicating an incoming vacuum source.

The switch controller 315 may include, for example, a solenoid switch that receives an input signal, and switches on or off, based on the received input signal. The input signal may indicate whether to turn on or off the switch controller 315. Based on the switch controller 315 being switched on, the switch controller 315 controls the nozzle 100 and the bond head heater 200 to provide a large die vacuum 330 to the large die, to pick up and hold the large die and then attach it to the substrate.

Based on the switch controller 305 being switched on, the sensor 310 senses a pressure of the small die vacuum 325 provided to the small die or the large die, and sends the sensed pressure to a display 320 (e.g., a computer monitor and/or a television). Based on the switch controller 315 being switched on, the sensor 310 senses the pressure of the small die vacuum 325 provided to the large die combined with the pressure of the large die vacuum 330 provided to the large die, and sends the combined pressures to the display 320. In an example, the sensor 310 may be triggered to sense only if a value of the small die vacuum 325 or the large die vacuum 330 is lower than predetermined limit value.

The display 320 receives, from the sensor 310, the sent pressure of the small die vacuum 325 or the sent pressures of the small die vacuum 325 and the large die vacuum 330, and displays the received pressure or pressures.

Figure 4:
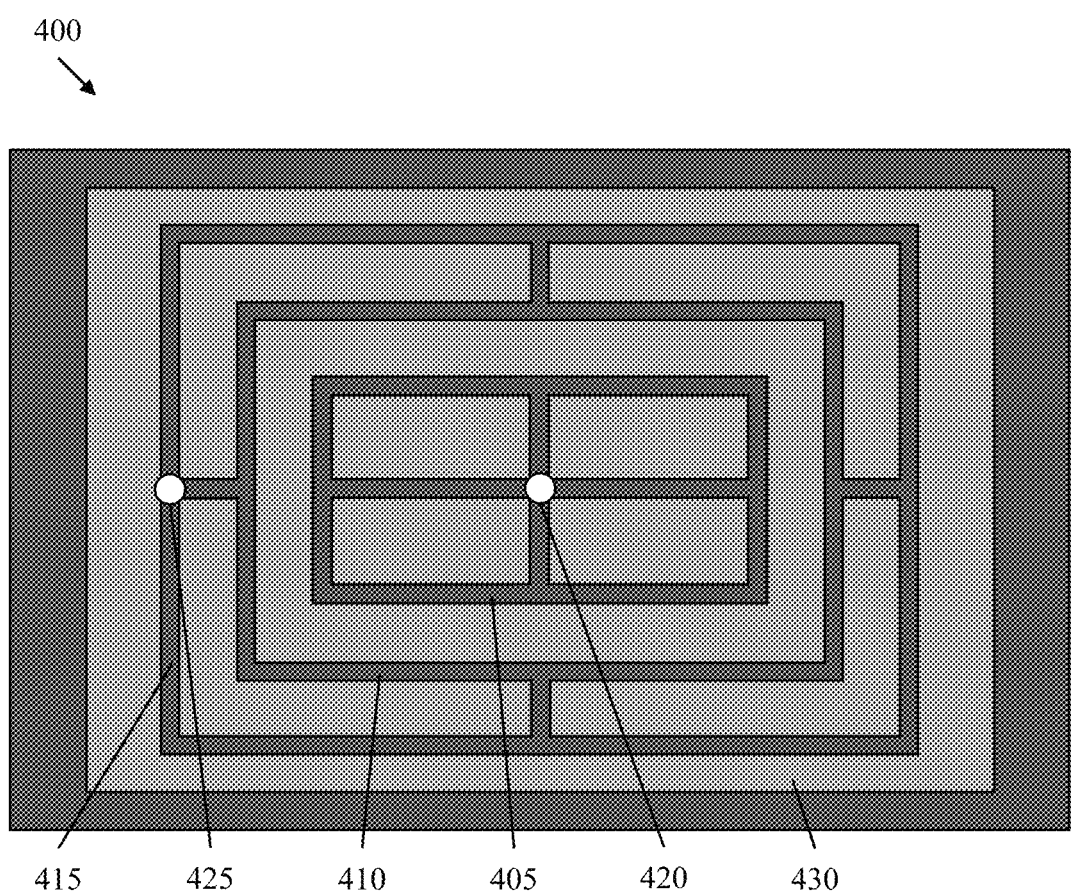
FIG. 4 is a top view of a nozzle of a TCB tool according to other aspects of the present disclosure.

FIG. 4 is a top view of a nozzle 400 of a TCB tool according to other aspects of the present disclosure.

Referring to FIG. 4, the nozzle 400 includes, on a surface 430, a small die vacuum line 405, a large die vacuum line 410 surrounding the small die vacuum line 405, and a large die vacuum line 415 surrounding the large die vacuum line 410. The large die vacuum line 410 covers a larger surface area than the small die vacuum line 405, and the large die vacuum line 415 covers a larger surface area than the large die vacuum line 410. The nozzle 400 further includes, through the surface 430, a die vacuum hole 420 disposed through (e.g., at a center of) the small die vacuum line 405, and a large die vacuum hole 425 disposed through the large die vacuum line 415. The die vacuum hole 420 and the large die vacuum hole 425 may be disposed along a line extending through a center of the surface 430 of the nozzle 400.

The nozzle 400 may be physically and directly placed on a die. The nozzle 400 may further receive a vacuum from a bond head heater, and may provide the vacuum to the die to pick up and hold the die for attachment to a substrate.

The small die vacuum line 405 and the die vacuum hole 420 may be used to provide the vacuum to a small, medium or large die. The small die vacuum line 405, the large die vacuum line 410, the large die vacuum line 415 and the die vacuum holes 420 and 425 may be combined and used to provide the vacuum to the large die. Accordingly, the one nozzle 400 may be used to provide the vacuum to three dies of different sizes.

The surface 430 of the nozzle 400 may transfer thermal to a die. The surface 430 may further create a closed loop with the die to prevent a leak of a vacuum that is provided to the die.

FIGS. 5A, 5B, 5C, 5D and 5E are cross-sectional diagrams of a method of bonding a small die 505 and a large die 510 to a substrate 515, using the nozzle 100 of FIG. 1, according to aspects of the present disclosure.

Previously, a sequence of bonding a small die and a large die to a substrate, using a TCB tool, was determined based on a product owner, a sit time of a power control unit (PCU) die, and/or a sit time of a platform controller hub (PCH) die. However, the sit time for the PCU die and the sit time for the PCH die may be the same for almost all products. Further, if the bonding sequence gives priority to the large die, then the bonding of the small die to the substrate may cause a problem of a nozzle's vacuum provided to the large die still affecting the large die as the vacuum is provided to the small die. This is especially the case if a distance between the small die and the large die is small.

Hence, referring to FIGS. 5A-5E, a sequence of bonding the small die 505 and the large die 510 to the substrate 515, using the nozzle 100, begins with bonding the small die 505 to the substrate 515, followed by bonding the large die 510 to the substrate 515.

Figure 5A:
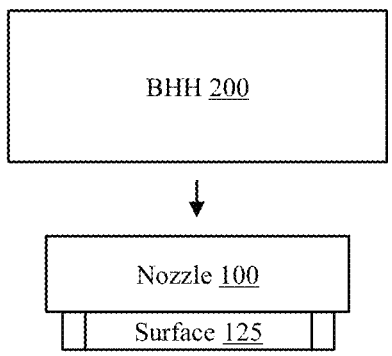
FIGS. 5A, 5B, 5C, 5D and 5E are cross-sectional diagrams of a method of bonding a small die and a large die to a substrate, using the nozzle of FIG. 1, according to aspects of the present disclosure.

In detail, as shown in FIG. 5A, the bond head heater 200 (BHH) of FIGS. 2A-2C may be physically and directly placed on the nozzle 100. The bond head heater 200 may then provide a vacuum to the nozzle 100 to pick up and hold the nozzle 100 on a bottom surface of the bond head heater 200. The bond head heater 200 may be placed using a robotic positioning system.

Figure 5B:
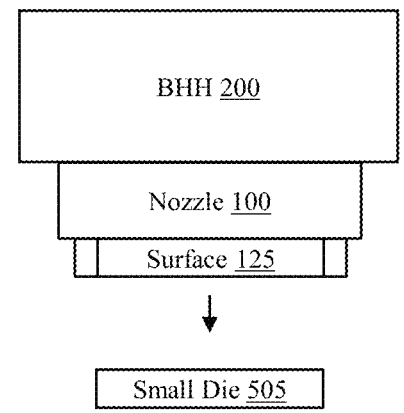

As shown in FIG. 5B, the nozzle 100 may be physically and directly placed on the small die 505, and may then provide a vacuum to the small die 505 to pick up and hold the small die 505 on the surface 125 of the nozzle 100, without affecting any die nearby the small die 505. The nozzle 100 may be placed using the robotic positioning system.

Figure 5C:
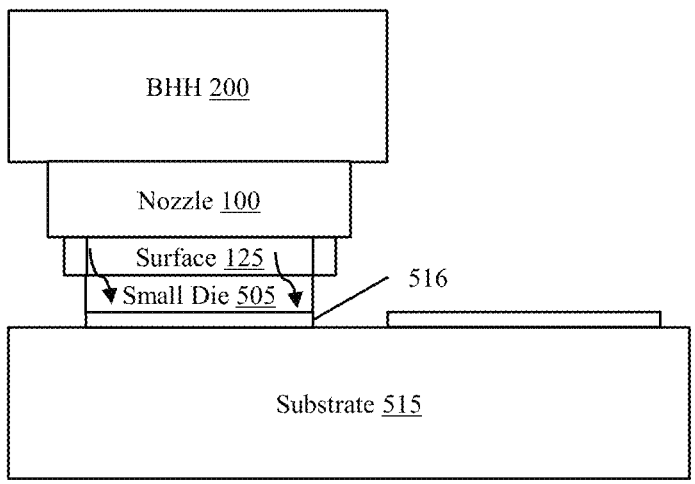

As shown in FIG. 5C, the small die 505 may be aligned with a contact pad 516 disposed on the substrate 515, and may be physically and directly placed on the contact pad 516. The bond head heater 200 may then heat, via the nozzle 505, the small die 505 to attach the small die 505 to the substrate 515. The small die 505 may be aligned and placed using the robotic positioning system.

Figure 5D:
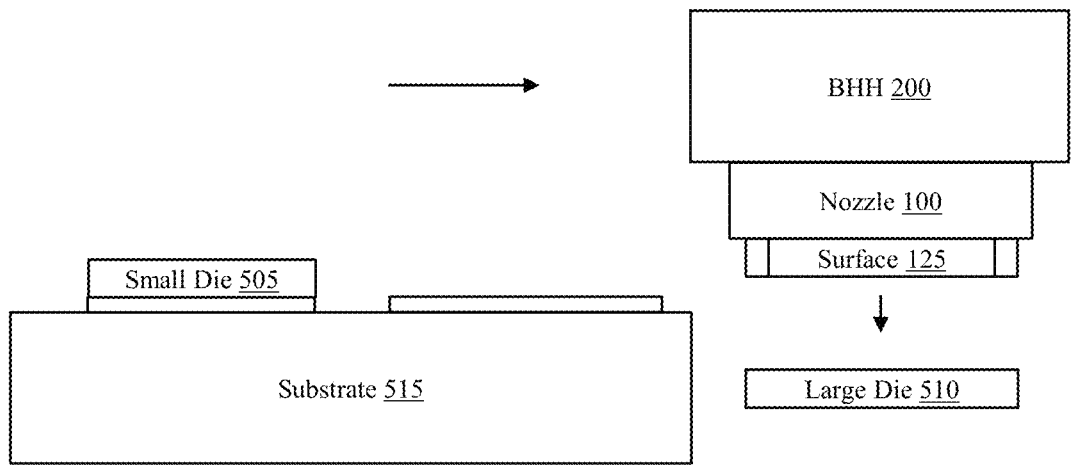

As shown in FIG. 5D, after the small die 505 is attached to the substrate 515, the bond head heater 200 may be cooled down, and the nozzle 100 may be released and moved away from the small die 505 to the large die 510, without affecting any die nearby the small die 505. The nozzle 100 may be released by ceasing the providing of the vacuum to the small die 505. Then, the nozzle 100 may be physically and directly placed on the large die 510, and may provide a vacuum to the large die 510 to pick up and hold the large die 510 on the surface 125 of the nozzle 100.

Figure 5E:
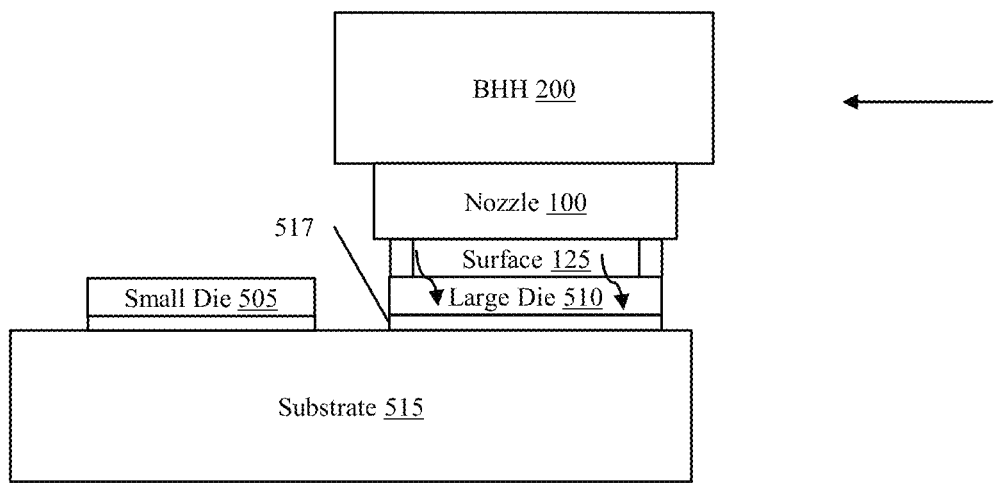

As shown in FIG. 5E, the large die 510 may be aligned with a contact pad 517 disposed on the substrate 515, and may be physically and directly placed on the contact pad 517. The bond head heater 200 may then heat, via the nozzle 505, the large die 510 to attach the large die 510 to the substrate 515. The large die 510 may be aligned and placed using the robotic positioning system.

The steps in FIGS. 5B-5E may be repeated until all dies are attached to the substrate 515.

Figure 6:
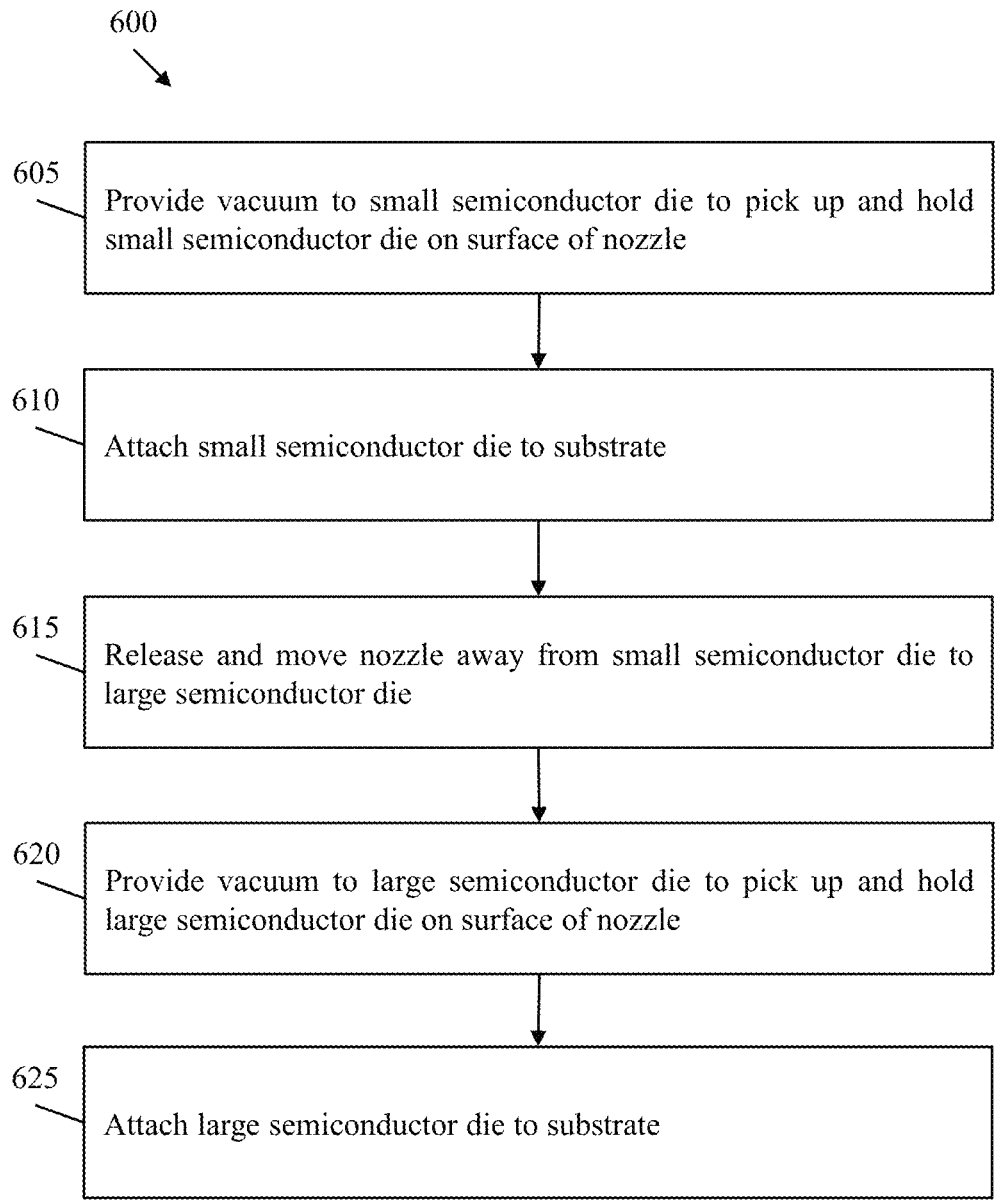
FIG. 6 is a flow diagram of a method of attaching a die to a substrate, using a TCB tool, according to aspects of the present disclosure.

FIG. 6 is a flow diagram of a method 600 of attaching a die to a substrate, using a TCB tool, according to aspects of the present disclosure.

Referring to FIG. 6, in operation 605, the method 600 may be directed to placing a nozzle on a small semiconductor die, and then providing a vacuum to the small semiconductor die to pick up and hold the small semiconductor die on a surface of the nozzle.

In operation 610, the method 600 may be directed to aligning the small semiconductor die with a contact pad on the substrate, placing the small semiconductor die on the contact pad, and then heating, via the nozzle, the small semiconductor die, to attach the small semiconductor die to the substrate.

In operation 615, the method 600 may be directed to, based on the small semiconductor die being attached to the substrate, releasing and moving the nozzle away from the small semiconductor die to a large semiconductor die.

In operation 620, the method 600 may be directed to placing the nozzle on the large semiconductor die, and then providing the vacuum to the large semiconductor die to pick up and hold the large semiconductor die on the surface of the nozzle.

In operation 625, the method 600 may be directed to aligning the large semiconductor die with a contact pad on the substrate, placing the large semiconductor die on the contact pad, and then heating, via the nozzle, the large semiconductor die, to attach the large semiconductor die to the substrate.

The methods and sequence of steps presented above are intended to be examples for attaching a die to a substrate, using a TCB tool, according to the present disclosure. It will be apparent to those ordinary skilled practitioners that the foregoing process operations may be modified without departing from the spirit of the present disclosure.

The above-described aspects of the present disclosure may save time and cost of changing a nozzle, increase runrate and optimize the die attachment process to help the TCB tool operate more stably.

To more readily understand and put into practical effect the present apparatuses and methods, particular aspects will now be described by way of examples. For the sake of brevity, duplicate descriptions of features and properties may be omitted.

EXAMPLES

Example 1 provides an apparatus including a nozzle including a small die vacuum line disposed on a surface of the nozzle, and a large die vacuum line disposed on the surface and surrounding the small die vacuum line. The nozzle further includes a first die vacuum hole disposed through the surface and the small die vacuum line, and a second die vacuum hole disposed through the surface and the large die vacuum line. The small die vacuum line and the first die vacuum hole are configured to provide a vacuum to a small semiconductor die to be attached to a substrate, and the small die vacuum line, the large die vacuum line, the first die vacuum hole and the second die vacuum hole are configured to provide the vacuum to a large semiconductor die to be attached to the substrate.

Example 2 may include the apparatus of example 1 and/or any other example disclosed herein, further including a bond head heater configured to provide the vacuum to the nozzle, and to heat, via the nozzle, the small semiconductor die and the large semiconductor die. The bond head heater may include another die vacuum line disposed on a bottom surface of the bond head heater, a third die vacuum hole disposed through the bottom surface, and a fourth die vacuum hole disposed through the bottom surface and the other die vacuum line. The other die vacuum line and the fourth die vacuum hole may be respectively aligned with the large die vacuum line and the second die vacuum hole, and the other die vacuum line, the third die vacuum hole and the fourth die vacuum hole may be configured to provide the vacuum to the large semiconductor die.

Example 3 may include the apparatus of example 2 and/or any other example disclosed herein, for which the third die vacuum hole may be aligned with the first die vacuum hole, and may be further configured to provide the vacuum to the small semiconductor die.

Example 4 may include the apparatus of example 3 and/or any other example disclosed herein, for which the bond head heater may further include a first die vacuum channel aligned with the third die vacuum hole, and configured to provide the vacuum to the small semiconductor die, and a second die vacuum channel aligned with the fourth die vacuum hole. The first die vacuum channel and the second die vacuum channel may be configured to provide the vacuum to the large semiconductor die.

Example 5 may include the apparatus of example 2 and/or any other example disclosed herein, for which a length of the other die vacuum line may correspond to a length between the first die vacuum hole and an edge of the nozzle.

Example 6 may include the apparatus of example 2 and/or any other example disclosed herein, further including a die vacuum controller including a first switch controller configured to switch on and off, based on an input signal. The nozzle and the bond head heater may be configured to, based on the first switch controller being switched on, provide the vacuum to the small semiconductor die and the large semiconductor die Example 7 may include the apparatus of example 6 and/or any other example disclosed herein, for which the die vacuum controller may further include a second switch controller configured to switch on and off, based on an input signal, and the nozzle and the bond head heater may be configured to, based on the second switch controller being switched on, provide the vacuum to the large semiconductor die.

Example 8 may include the apparatus of example 6 and/or any other example disclosed herein, for which the die vacuum controller may further include a sensor configured to sense a pressure of the vacuum, and the apparatus may further include a display configured to display the sensed pressure of the vacuum.

Example 9 may include the apparatus of example 1 and/or any other example disclosed herein, for which the nozzle may further include another large die vacuum line disposed on the surface and surrounding the small die vacuum line, and the large die vacuum line may surround the other large die vacuum line.

Example 10 may include the apparatus of example 9 and/or any other example disclosed herein, for which small die vacuum line and the first die vacuum hole may be further configured to provide the vacuum to a medium semiconductor die to be attached to the substrate, and the small die vacuum line, the large die vacuum line, the other large die vacuum line, the first die vacuum hole and the second die vacuum hole may be configured to provide the vacuum to the large semiconductor die.

Example 11 provides a method including providing a vacuum to a small semiconductor die, to pick up and hold the small semiconductor die on a surface of the nozzle, attaching the held small semiconductor die to a substrate, and based on the small semiconductor die being attached to the substrate, releasing and moving the nozzle away from the small semiconductor die to a large semiconductor die. The method further includes providing the vacuum to the large semiconductor die to which the nozzle is moved, to pick up and hold the large semiconductor die on the surface of the nozzle, and attaching the held large semiconductor die to the substrate Example 12 may include the method of example 11 and/or any other example disclosed herein, for which the attaching the held small semiconductor die to the substrate may include heating, via the nozzle, the small semiconductor die, using a bond head heater.

Example 13 may include the method of example 11 and/or any other example disclosed herein, for which the attaching the held large semiconductor die to the substrate may include heating, via the nozzle, the large semiconductor die, using a bond head heater.

Example 14 may include the method of example 11 and/or any other example disclosed herein, for which the releasing the nozzle away from the small semiconductor die may include ceasing the providing of the vacuum to the small semiconductor die.

Example 15 may include the method of example 11 and/or any other example disclosed herein, further including providing the vacuum to the nozzle, to pick up and hold the nozzle on a surface of a bond head heater.

Example 16 provides an apparatus including providing means for providing a vacuum to a small semiconductor die, to pick up and hold the small semiconductor die on a surface of the nozzle, attaching means for attaching the held small semiconductor die to a substrate, and moving means for, based on the small semiconductor die being attached to the substrate, releasing and moving the nozzle away from the small semiconductor die to a large semiconductor die. The providing means are further for providing the vacuum to the large semiconductor die to which the nozzle is moved, to pick up and hold the large semiconductor die on the surface of the nozzle, and the attaching means are further for attaching the held large semiconductor die to the substrate.

Example 17 may include the apparatus of example 16 and/or any other example disclosed herein, for which the attaching means may be further for heating, via the nozzle, the small semiconductor die.

Example 18 may include the apparatus of example 16 and/or any other example disclosed herein, for which the attaching means may be further for heating, via the nozzle, the large semiconductor die.

Example 19 may include the apparatus of example 16 and/or any other example disclosed herein, for which the moving means may be further for ceasing the providing of the vacuum to the small semiconductor die.

Example 20 may include the apparatus of example 19 and/or any other example disclosed herein, for which the providing means may be further for providing the vacuum to the nozzle, to pick up and hold the nozzle on a surface of a bond head heater.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The methods described herein may be performed and the various processing or computation units and the devices and computing entities described herein may be implemented by one or more circuits. In an embodiment, a "circuit" may be understood as any kind of a logic implementing entity, which may be hardware, software, firmware, or any combination thereof. Thus, in an embodiment, a "circuit" may be a hard-wired logic circuit or a programmable logic circuit such as a programmable processor, e.g., a microprocessor. A "circuit" may also be software being implemented or executed by a processor, e.g., any kind of computer program, e.g., a computer program using a virtual machine code. Any other kind of implementation of the respective functions that are described herein may also be understood as a "circuit" in accordance with an alternative embodiment.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. An apparatus comprising:
    a nozzle comprising:
      a small die vacuum line disposed on a surface of the nozzle;
      a large die vacuum line disposed on the surface and surrounding the small die vacuum line;
      a first die vacuum hole disposed through the surface and the small die vacuum line; and
      a second die vacuum hole disposed through the surface and the large die vacuum line;
    a bond head heater configured to provide a vacuum to the nozzle, and to heat, via the nozzle, a small semiconductor die and a large semiconductor die, the bond head heater comprising:
      another die vacuum line disposed on a bottom surface of the bond head heater;
      a third die vacuum hole disposed through the bottom surface; and
      a fourth die vacuum hole disposed through the bottom surface and the other die vacuum line,
    wherein the small die vacuum line and the first die vacuum hole are configured to provide a vacuum to the small semiconductor die to be attached to a substrate,
    the other die vacuum line and the fourth die vacuum hole are respectively aligned with the large die vacuum line and the second die vacuum hole, and
    the small die vacuum line, the large die vacuum line, the other die vacuum line, the first die vacuum hole, the second die vacuum hole, the third die vacuum hole, and the fourth die vacuum hole are configured to provide the vacuum to the large semiconductor die to be attached to the substrate.

2. The apparatus of claim 1, wherein the third die vacuum hole is aligned with the first die vacuum hole, and is further configured to provide the vacuum to the small semiconductor die.

3. The apparatus of claim 2, wherein the bond head heater further comprises:
a first die vacuum channel aligned with the third die vacuum hole, and configured to provide the vacuum to the small semiconductor die; and
a second die vacuum channel aligned with the fourth die vacuum hole,
wherein the first die vacuum channel and the second die vacuum channel are configured to provide the vacuum to the large semiconductor die.

4. The apparatus of claim 1, wherein a length of the other die vacuum line corresponds to a length between the first die vacuum hole and an edge of the nozzle.

5. The apparatus of claim 1, further comprising a die vacuum controller comprising:
a first switch controller configured to switch on and off, based on an input signal,
wherein the nozzle and the bond head heater are configured to, based on the first switch controller being switched on, provide the vacuum to the small semiconductor die and the large semiconductor die.

6. The apparatus of claim 5, wherein the die vacuum controller further comprises a second switch controller configured to switch on and off, based on an input signal,
wherein the nozzle and the bond head heater are configured to, based on the second switch controller being switched on, provide the vacuum to the large semiconductor die.

7. The apparatus of claim 1, wherein the die vacuum controller further comprises a sensor configured to sense a pressure of the vacuum, and
the apparatus further comprises a display configured to display the sensed pressure of the vacuum.

8. The apparatus of claim 1, wherein the nozzle further comprises another large die vacuum line disposed on the surface and surrounding the small die vacuum line, and
the large die vacuum line surrounds the other large die vacuum line.

9. The apparatus of claim 8, wherein the small die vacuum line and the first die vacuum hole are further configured to provide the vacuum to a medium semiconductor die to be attached to the substrate, and
the small die vacuum line, the other large die vacuum line, the large die vacuum line, the first die vacuum hole and the second die vacuum hole are configured to provide the vacuum to the large semiconductor die.

10. A method comprising:
providing a vacuum to a small semiconductor die, to pick up and hold the small semiconductor die on a surface of the nozzle;
attaching the held small semiconductor die to a substrate; based on the small semiconductor die being attached to the substrate, releasing and moving the nozzle away from the small semiconductor die to a large semiconductor die;
providing the vacuum to the large semiconductor die to which the nozzle is moved, to pick up and hold the large semiconductor die on the surface of the nozzle; and
attaching the held large semiconductor die to the substrate.

11. The method of claim 10, wherein the attaching the held small semiconductor die to the substrate comprises heating, via the nozzle, the small semiconductor die, using a bond head heater.

12. The method of claim 10, wherein the attaching the held large semiconductor die to the substrate comprises heating, via the nozzle, the large semiconductor die, using a bond head heater.

13. The method of claim 10, wherein the releasing the nozzle away from the small semiconductor die comprises ceasing the providing of the vacuum to the small semiconductor die.

14. The method of claim 10, further comprising providing the vacuum to the nozzle, to pick up and hold the nozzle on a surface of a bond head heater.

15. An apparatus comprising:
providing means for providing a vacuum to a small semiconductor die, to pick up and hold the small semiconductor die on a surface of the nozzle;
attaching means for attaching the held small semiconductor die to a substrate; and
moving means for, based on the small semiconductor die being attached to the substrate, releasing and moving the nozzle away from the small semiconductor die to a large semiconductor die,
wherein the providing means are further for providing the vacuum to the large semiconductor die to which the nozzle is moved, to pick up and hold the large semiconductor die on the surface of the nozzle, and
the attaching means are further for attaching the held large semiconductor die to the substrate.

16. The apparatus of claim 15, wherein the attaching means are further for heating, via the nozzle, the small semiconductor die.

17. The apparatus of claim 15, wherein the attaching means are further for heating, via the nozzle, the large semiconductor die.

18. The apparatus of claim 15, wherein the moving means are further for ceasing the providing of the vacuum to the small semiconductor die.

19. The apparatus of claim 15, wherein the providing means are further for providing the vacuum to the nozzle, to pick up and hold the nozzle on a surface of a bond head heater.

* * * * *